(12) United States Patent
Oshetski et al.

(10) Patent No.: US 7,616,019 B2
(45) Date of Patent: Nov. 10, 2009

(54) LOW PROFILE ELECTRONIC ASSEMBLY TEST FIXTURES

(75) Inventors: Walter E. Oshetski, Lafayette, CO (US); Todd C. Wyant, Louisville, CO (US); Matthew J. Wickett, Mead, CO (US)

(73) Assignee: Aspen Test Engineering, Inc., Lafayette, CO (US)

( * ) Notice: Subject to any disclaimer, the term of this patent is extended or adjusted under 35 U.S.C. 154(b) by 188 days.

(21) Appl. No.: 11/430,784

(22) Filed: May 8, 2006

(65) Prior Publication Data

US 2007/0257690 A1 Nov. 8, 2007

(51) Int. Cl.
*G01R 31/02* (2006.01)
(52) U.S. Cl. .................................. 324/761; 324/754
(58) Field of Classification Search .................. None
See application file for complete search history.

(56) References Cited

U.S. PATENT DOCUMENTS

| | | | | |
|---|---|---|---|---|
| 4,017,793 | A | * | 4/1977 | Haines ...................... 324/763 |
| 4,061,969 | A | | 12/1977 | Dean |
| 4,643,501 | A | | 2/1987 | Coffin |
| 4,746,861 | A | | 5/1988 | Nesbitt |
| 4,749,945 | A | | 6/1988 | Bonifert et al. |
| 4,870,354 | A | * | 9/1989 | Davaut ...................... 324/757 |
| 4,884,024 | A | | 11/1989 | DiPerna |
| 4,885,533 | A | | 12/1989 | Coe |
| 4,935,696 | A | | 6/1990 | DiPerna |
| 4,977,370 | A | * | 12/1990 | Andrews ................... 324/761 |
| 5,450,017 | A | | 9/1995 | Swart |
| 5,506,510 | A | | 4/1996 | Blumenau |
| 5,510,722 | A | | 4/1996 | Seavey |
| 5,773,988 | A | | 6/1998 | Sayre et al. |
| 5,883,520 | A | | 3/1999 | Delfosse et al. |
| 5,945,836 | A | | 8/1999 | Sayre et al. |
| 6,005,405 | A | | 12/1999 | Slutz |
| 6,025,729 | A | | 2/2000 | Van Loan et al. |
| 6,043,669 | A | * | 3/2000 | Carroll ...................... 324/761 |
| 6,066,957 | A | | 5/2000 | Van Loan et al. |
| 6,130,547 | A | | 10/2000 | Kato |
| 6,225,817 | B1 | | 5/2001 | Sayre et al. |
| 6,259,265 | B1 | | 7/2001 | Han et al. |
| 6,400,169 | B1 | | 6/2002 | Hembree |
| 6,407,565 | B1 | | 6/2002 | Sayre et al. |
| 6,414,502 | B1 | | 7/2002 | Sayre et al. |
| 6,414,504 | B2 | | 7/2002 | Johnston |
| 6,422,886 | B1 | | 7/2002 | Macbeth et al. |

(Continued)

*Primary Examiner*—Vinh P Nguyen
(74) *Attorney, Agent, or Firm*—Harold A. Burdick

(57) ABSTRACT

Low profile printed circuit board assembly test fixtures and methods are disclosed, the fixtures mountable at a tester having a plurality of conductive interface contacts. The fixture includes a low profile mount defined by a frame having an interface bed at one end and a dynamic plate movably positioned at an opposite end thereof, a chamber being thereby defined and having an opening for evacuating air therefrom to effect movement of the plate. A plurality of conductive terminals extend through the interface bed, each of the terminals having a node at one end positioned at the bottom surface of the bed and corresponding to the position of one of the conductive interface contacts of the tester. A plurality of conductive probes in the chamber are secured at the top surface of the bed, are coupled to the terminals, and extend through the plate. The electronic assembly is selectively positioned atop the plate for probe access.

17 Claims, 7 Drawing Sheets

U.S. PATENT DOCUMENTS

| | | |
|---|---|---|
| 6,469,531 B1 | 10/2002 | Sayre et al. |
| 6,570,399 B2 | 5/2003 | Yeghiayan et al. |
| 6,628,130 B2 | 9/2003 | Williams et al. |
| 2003/0030454 A1 | 2/2003 | DeSimone |
| 2003/0234656 A1 | 12/2003 | Willard |

\* cited by examiner

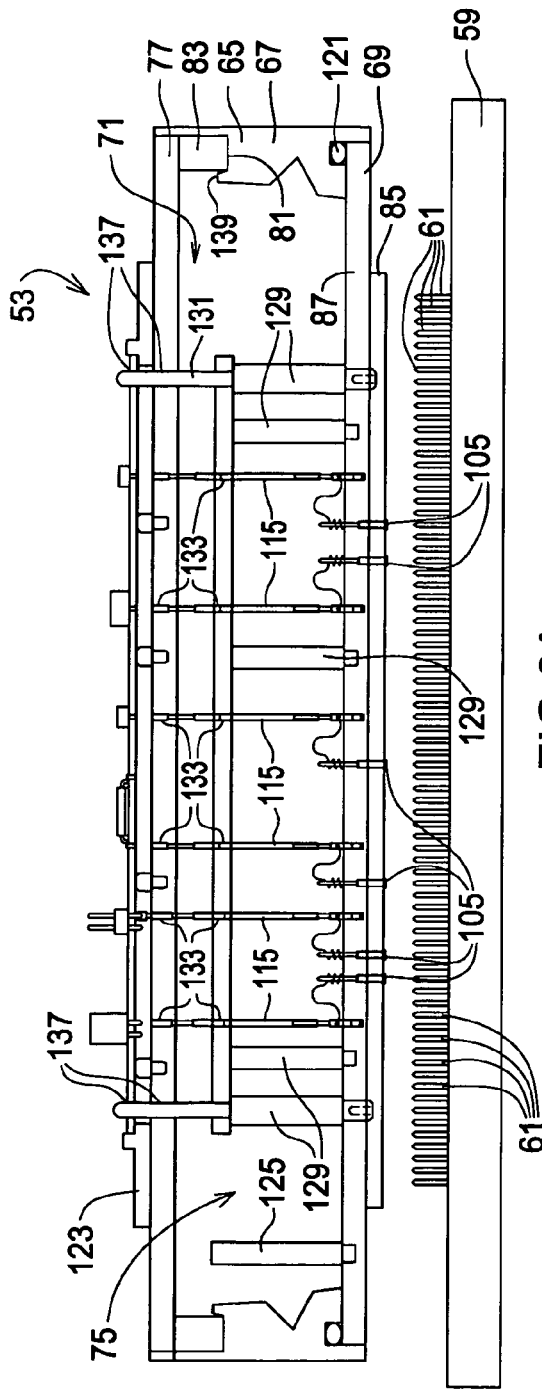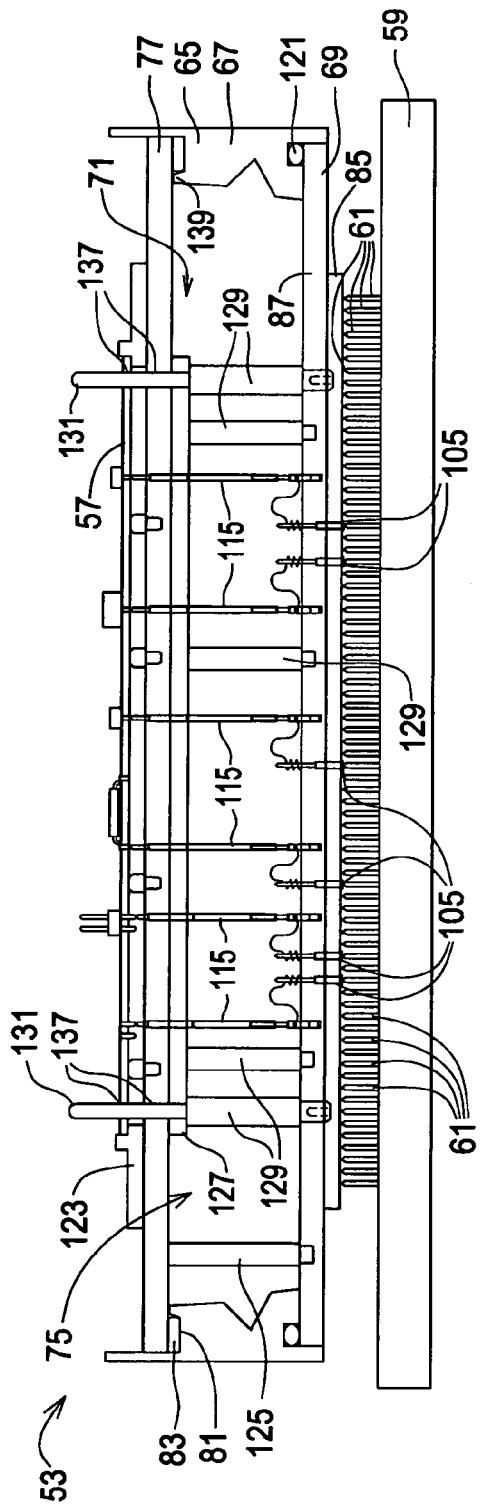
FIG.6A
FIG.6B

LOW PROFILE ELECTRONIC ASSEMBLY TEST FIXTURES

FIELD OF THE INVENTION

This invention relates to electronics testing equipment and methods, and, more particularly, relates to test fixtures and methods for electronic assemblies such as printed circuit boards.

BACKGROUND OF THE INVENTION

One of the challenges in the manufacturing of today's complex electronics is verification of correctness of assembly. Electronic components are commonly assembled onto a printed circuit board (PCB). This board is made of substrate layers (commonly of FR4 grade fiberglass) with copper laminated onto the surface of each layer (as few as 2 layers of copper may be used, though often many layers are required). Each of these copper layers is etched using a photographic process, the resulting patterns of copper providing conductive paths on (and through) the PCB. On the outer surfaces of the PCB copper pads are positioned which reflect the layout of the leads (i.e., legs or pins) of the electronic components that will be attached (typically soldered) to the PCB. The resulting assembly is known as a printed circuit board assembly (PCBA).

Configurable fixtures for testing of PCBA have long been known and utilized. The most common variety, known generically as a "bed of nails" fixture, has taken various forms (see, for example, U.S. Pat. Nos. 4,643,501, 5,510,722, 5,450,017 and 6,469,531) and is engageable with any of a variety of known commercially available test system assemblies which provide standardized testing algorithms used to produce electrical stimulus and measure responses of the individual components installed on the PCBA. Provision of full access to every circuit net (i.e., node) of the PCBA thus allows all components to be verified for proper value and function, and such bed of nails fixtures are configured to allow simultaneous engagement of test leads with each selected circuit net of the PCBA under test (often referred to as the UUT, Unit Under Test). Heretofore known and/or utilized fixtures have met the challenge of accurate node contact with as ideal an electrical connection as possible with varying degrees of success.

Node contact pins, known as spring probes, are utilized most commonly in modern test fixtures (see U.S. Pat. Nos. 6,570,399, 4,885,533 and 4,749,945, for example). These probes are positioned at locations in the fixture to allow engagement with the soldered connection of the component leads or other patterns etched on the PCB. The goal of spring probe placements is to have a dedicated probe making contact to every net on the UUT.

Engagement of the spring probes at the UUT has heretofore been accomplished by mechanical clamping, pneumatic cylinders, or vacuum actuated fixturing, the latter currently thought to be the most cost effective. In such fixtures, the UUT is carried atop a moveable plate which is pulled downward upon application of vacuum to a chamber beneath it. The spring probes are located in sockets that are pressed into a second stationary plate and contact the surface of the UUT at locations defined by the topography of the UUT. The sockets are provided with an attachment for wires at the opposite side from the probes (commonly using a wire wrap style connection, though other electrical connection methods are known). The opposite ends of the wires are connected to contacts at an interface configured to correspond to a standard grid of one of the variety of commercially available testers (see U.S. Pat. No. 5,510,722, for example).

Having reference to FIG. 1, a type of vacuum actuated test fixture 12 typical of the prior art for testing UUT's utilizing a standard commercially available tester is shown. These wired fixtures current employ a three plate design. Interface plate 14 is engagable with tester interface 16 of a commercial tester. Probe plate 18 has sockets 20 selectively positioned thereat, sockets 20 receiving probes 22 therein, the probes engaging the selected nodes of the PCBA 24 under test (the UUT). Each probe plate 18 is of necessity configured to accommodate a particular PCBA 24. Diaphragm plate 26 carries PCBA 24. These three plates (14, 18 and 26) define two chambers in prior art fixture 12, upper chamber 28 (the variable volume vacuum chamber, shown in its fully contracted, vacuum-applied state) between the probe plate 18 and diaphragm plate 26 which contracts or expands responsive to application and release, respectively, of vacuum applied in the conventional manner to fixture 12, and lower chamber 30 (the wiring chamber) between interface plate 14 and probe plate 18.

Interface plate 14 (typically a stable FR4 fiberglass material) has a multiplicity of interface wiring terminals 32 which are pressed into thru-holes drilled at standard grid locations corresponding to the tester's matching array of interface pins 34. Terminals 32 are typically wire wrap style terminals. Chamber 30 is thus cluttered with wires 36 extending from terminals 32 to terminals 38 at the opposite side of spring probe sockets 20. Wires 36 are necessary relatively long (300 cm to 1 meter) since access to wiring chamber 30 is required. Hinge 40 connected with the housing holding plates 18/26 allows opening and closing of wiring chamber 30.

Vacuum chamber 28 is provided with small spacers 42 which set the distance between diaphragm plate 26 and probe plate 18 after the chamber is evacuated (providing a small space that keeps the vacuum force applied at diaphragm plate 26). Probe plate 18, diaphragm plate 26, PCBA 24, and the field of spring probes 22 together are called the vacuum head. The vacuum head is not mechanically coupled to any other structure and is hence a stand-alone system. Mechanically, after vacuum chamber 28 is fully evacuated and static, plates 26/18 are subject to flexure, an undesirable consequence that should be minimized (such movement effects probe contact location and stability and thus fixture precision and reliability). Dynamic flexure is dependent on plate thicknesses and the probe field forces.

An alternative to wired test fixtures (such as that shown in FIG. 1) has heretofore been suggested and/or utilized (see U.S. Pat. Nos. 6,628,130, 6,025,729 and 6,066,957). One such wireless fixture, for example, substitutes a double sided printed circuit board for the traditional fixture interface plate engagable at the tester. The circuit board provides conductive traces which make connections from the tester's standard interface to the probes contacting the UUT. These fixtures still require a three plate design (an interface plate that connects to the test system, a probe plate which positions the probes for engagement to the UUT, and a diaphragm plate which is the carrier for the UUT). There still exist two separate chambers, the lower chamber between the interface plate and probe plate and the upper chamber between the probe plate and diaphragm plate. A double-sided spring probe is used to make contact from the interface circuit board to the bottom connection of the probe socket. The upper end of the socket contains a second spring probe which contacts the UUT.

Various other test fixture embodiments have been heretofore suggested and/or utilized that employ translator boards between the interface plate and the probe plate (see U.S. Pat. Nos. 4,935,696, 6,005,405 and 4,884,024, and U.S. Patent Application Publication No. US2003/0030454). These fixtures allow utilization of shorter wiring pathes, but otherwise still require multiple plates (typically four including the interface plate, probe plate, UUT positioning plate and translator plate), as well as multiple different types of probes and sockets.

All of the heretofore known and/or utilized fixtures have suffered to one degree or another from mechanical disadvantages due to the unfettered nature of the vacuum chamber and the relative lack of support for the probe plate and diaphragm plate. Additionally, modifications of probe locations and related interface connections are not easily accommodated by some heretofore known alternatively designed fixtures, since such changes would require that the printed circuit board be redesigned. Other attempts at improvement have merely resulted in overly complex, and thus expensive, designs and modifications, and/or have made the installation of PCBA's, probes, terminals and wiring (where present) burdensome.

Since electronic components continue to shrink in size, fixture design must accommodate target areas for spring probe contacts that also continue to be reduced in size. This in turn requires the mechanical functioning of such fixtures to be more precise and stable. One factor affecting the precision and accuracy probe contact at selected UUT locations is flexure of fixture components subject to vacuum. Another factor is the overall length of the probe itself; a shorter probe is less likely to produce error due to the azimuth angle.

Since ever higher frequencies are utilized by electronic components, it is ever more desirable to keep signal paths in test fixtures as short as possible. This eliminates error due to noise and due to transmission path resistive and reactive impedance losses. The shorter the signal path, the better the testing accuracy.

It can be appreciated, therefor, that further improvement in electronic assembly test fixtures and methods, particularly those improvements directed to accommodating better mechanical functioning and shorter signal paths, could thus still be utilized.

SUMMARY OF THE INVENTION

This invention provides low profile electronic assembly test fixtures and methods that improve test fixture mechanical functionality related to vacuum chamber performance and probe and UUT support. The test fixtures and methods of this invention more readily allow modification of probe locations and related test system assembly interface connections, provide better precision and stability in probe location and contact at UUT node sites, and accommodate shorter signal paths through the test fixture. The fixtures are relatively easy to use and install, and are relatively inexpensive to produce.

The low profile electronic assembly test fixture of this invention is mountable at a tester having a plurality of conductive interface contacts at one part thereof. One embodiment of the fixture includes an interface bed having top and bottom surfaces, a plurality of conductive terminals extending through the interface bed between the surfaces thereof. Each of the terminals has a node at one end positioned at the bottom surface of the bed to correspond to position of one of the conductive interface contacts of the tester. A connection facility is located at an opposite end of the terminals positioned at the top surface of the bed.

A plurality of conductive probes is secured at the top surface of the bed, each selectively conductively couplable to a selected one of the terminal connection facilities. A dynamic plate assembly includes a support for receiving and positioning the electronic assembly at the plate assembly and has a plurality of openings therethrough corresponding to conductive probe positions at the bed. A mount has the bed secured at one end and the dynamic plate assembly dynamically positioned at an opposite end.

The mount has a low profile, a chamber being defined therein and bounded by the top surface of the bed and the plate assembly, the chamber having an opening thereto for evacuating air to effect movement of the plate assembly. The conductive probes are located in the chamber and extend through the plate assembly.

The methods of this invention are applied to access selected circuit nodes on an electronic assembly for assembly testing using a commercially available tester. The method steps include positioning conductive terminals in a field corresponding to at least portions of the pattern of conductive interface contacts of the tester, the terminals for engaging the interface contacts. Probes are positioned laterally adjacent to the terminals in the field of terminals establishing a probe pattern corresponding to positions of the selected circuit nodes of the electronic assembly.

Different ones of the probes and different ones of the terminals are selectively conductively coupled, and the electronic assembly is dynamically held at a selected location relative to the tester and the pattern of probes. The electronic assembly is moved toward the probes to effect contact between the probes and the selected circuit nodes.

Another embodiment of the fixture of this invention allows probe contact at both surfaces of the electronic assembly. This embodiment also includes a top dynamic plate spaced from the dynamic plate assembly at the opposite end of the mount. Conductive top access probes are secured at the top dynamic plate. A plurality of conductive transfer probe assemblies extends through the dynamic plate assembly and are secured at the bed and the top dynamic plate. Different ones of the transfer probes are conductively coupled to selected ones of the top access probes and the connection facilities of the conductive terminals at the bed. In this manner movement of at least a portion of the dynamic plate assembly and the top dynamic plate provide both top and bottom probe contact at the electronic assembly.

It is therefore an object of this invention to provide low profile electronic assembly test fixtures and methods.

It is another object of this invention to provide electronic assembly test fixtures and methods that improve test fixture mechanical functionality related to vacuum chamber performance and probe and UUT support.

It is still another object of this invention to provide electronic assembly test fixtures and methods that more readily allow modification of probe locations and related test system assembly interface connections, provide better precision and stability in probe location and contact at UUT node sites, and accommodate shorter signal paths through the test fixture.

It is yet another object of this invention to provide electronic assembly test fixtures and methods that are simpler to use and install, and are relatively inexpensive to produce.

It is still another object of this invention to provide an electronic assembly test fixture mountable at a tester having a plurality of conductive interface contacts, the fixture including an interface bed having top and bottom surfaces, a plurality of conductive terminals extending through the interface bed between the top and bottom surfaces thereof, each of the terminals having a node at one end positioned at the bottom surface of the bed to correspond to position of one of the conductive interface contacts of the tester, and having a connection facility at an opposite end positioned at the top surface of the bed, a plurality of conductive probes secured at the top surface of the bed and selectively conductively couplable to a selected terminal connection facility, a dynamic plate assembly including a support for receiving the electronic assembly, the plate assembly having a plurality of openings therethrough corresponding to conductive probe positions at the bed, and a mount having the bed secured at one end and the dynamic plate assembly dynamically positioned at an opposite end.

It is yet another object of this invention to provide a low profile printed circuit board assembly test fixture mountable at a tester having a plurality of conductive interface contacts, the fixture including a low profile mount including an interface bed having top and bottom surfaces at one end and a dynamic plate movably positioned at an opposite end, a chamber being thereby defined and bounded by the top surface of the bed and the plate, the chamber having an opening thereto for evacuating air from the chamber to effect movement of the plate, a plurality of conductive terminals extending through the interface bed between the top and bottom surfaces thereof, each of the terminals having a node at one end positioned at the bottom surface of the bed to correspond to position of one of the conductive interface contacts of the tester, and having a connection facility at an opposite end positioned at the top surface of the bed in the chamber, a plurality of conductive probes in the chamber secured at the top surface of the bed and selectively conductively couplable to a selected the terminal connection facility, the probes extending through the plate, and positioning means adjacent to the plate for selectively positioning the electronic assembly at the plate.

It is yet another object of this invention to provide a method for accessing selected circuit nodes on an electronic assembly for assembly testing using a commercially available tester having a pattern of conductive interface contacts at one part thereof, the method stops including positioning conductive terminals in a field corresponding to at least portions of the pattern of conductive interface contacts of the tester, the terminals for engaging the interface contacts, positioning probes laterally adjacent to the terminals in the field of terminals, the probes positioned in a pattern corresponding to positions of the selected circuit nodes of the electronic assembly, selectively conductively coupling different ones of the probes and different ones of the terminals, dynamically holding the electronic assembly at a selected location relative to the tester and the pattern of the probes, and causing movement of the electronic assembly toward the probes to effect contact between the probes and the selected circuit nodes.

It is still another object of this invention to provide an electronic assembly test fixture mountable at a tester having a plurality of conductive interface contacts, the fixture for accessing circuit nodes at both sides of the electronic assembly and including an interface bed, a plurality of conductive terminals at the interface bed, a plurality of conductive probes secured at the top surface of the bed and selectively conductively couplable to the terminals, a dynamic plate assembly, the plate assembly having a plurality of openings therethrough corresponding to conductive probe positions at the bed, a top dynamic plate spaced from the dynamic plate assembly, a mount having the bed secured at one end and the dynamic plate assembly and top dynamic plate dynamically positioned at an opposite end, a plurality of conductive top access probes secured at the top dynamic plate, and a plurality of conductive transfer probe assemblies extended through the dynamic plate assembly and secured at the bed and the top dynamic plate, different ones of the transfer probes conductively coupled to selected ones of the top access probes and the connection facilities of the conductive terminals at the bed.

With these and other objects in view, which will become apparent to one skilled in the art as the description proceeds, this invention resides in the novel construction, combination, and arrangement of parts and methods substantially as hereinafter described, and more particularly defined by the appended claims, it being understood that changes in the precise embodiment of the herein disclosed invention are meant to be included as come within the scope of the claims.

BRIEF DESCRIPTION OF THE DRAWINGS

The accompanying drawings illustrate a complete embodiment of the invention according to the best mode so far devised for the practical application of the principles thereof, and in which:

FIGS. 6A and 6B are sectional illustrations of lower portions of the test fixture shown in FIGS. 1 through 5 illustrating operation thereof;

DESCRIPTION OF THE INVENTION

Figure 1:
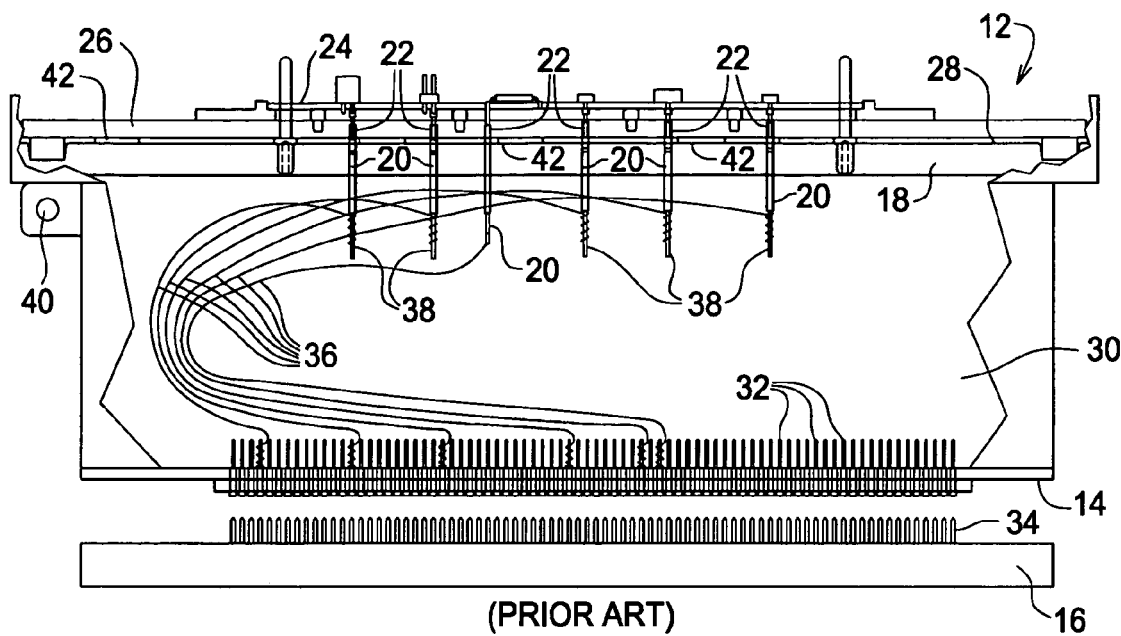
FIG. 1 is a sectional view illustration of a heretofore known and utilized variety of printed circuit board assembly test fixture.
Figure 2:
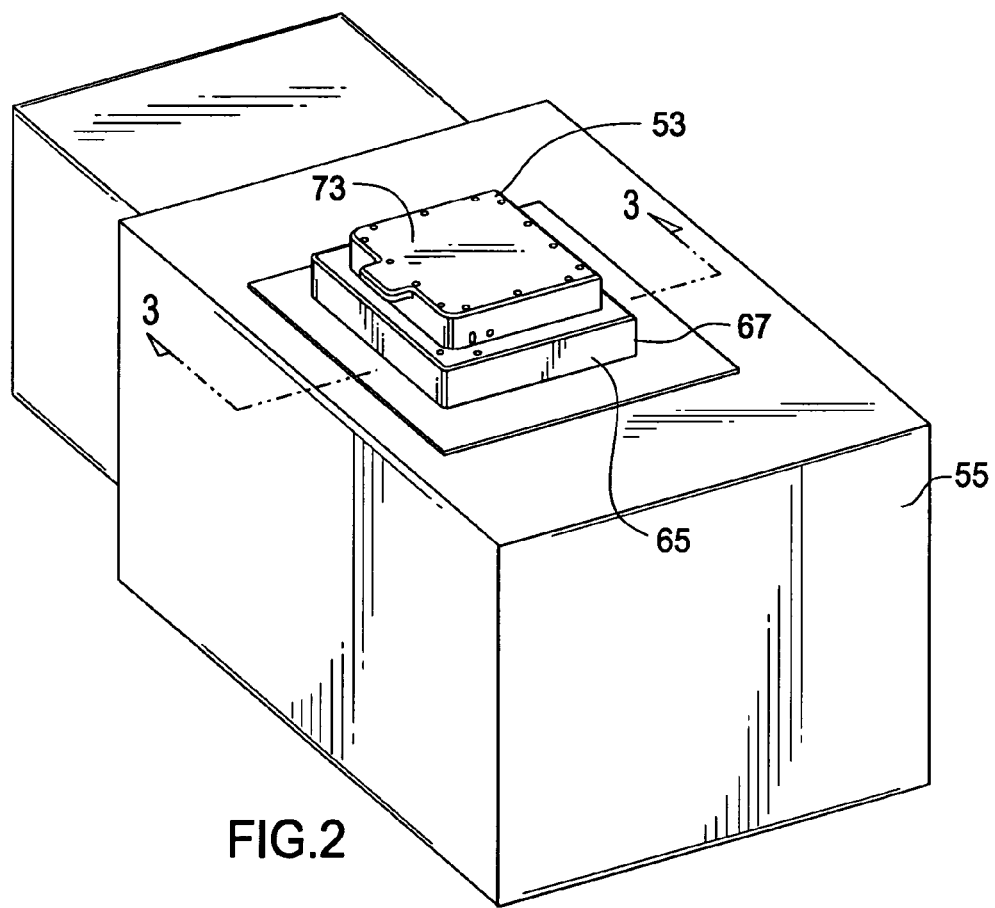
FIG. 2 is a perspective view of a first embodiment of the electronic assembly test fixture of this invention mounted on a standard commercially available test system assembly.
Figure 3:
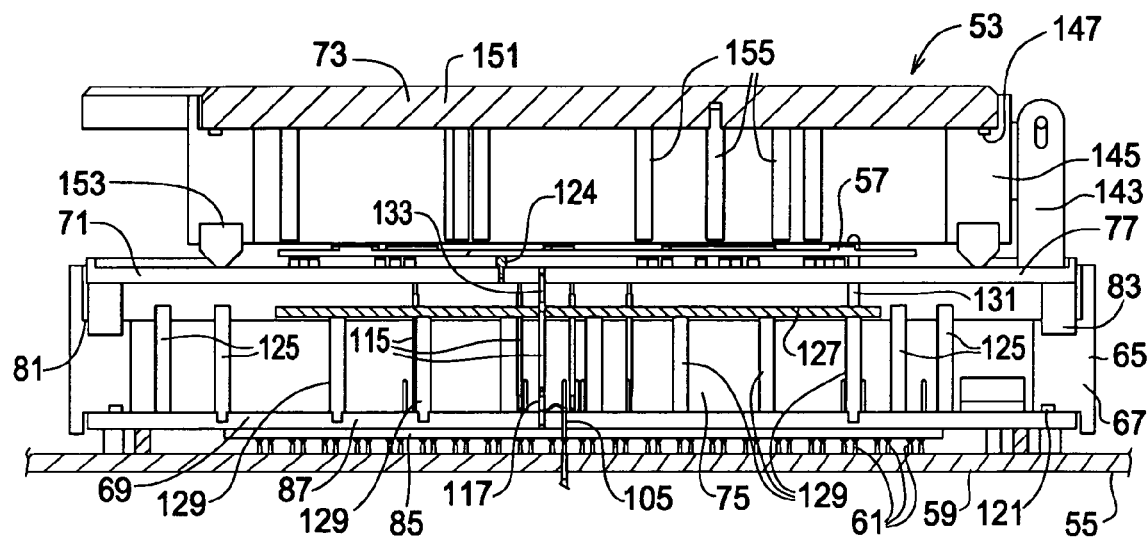
FIG. 3 is a sectional view taken through section lines 3-3 of FIG. 2.

FIGS. 2 through 6B illustrate a first embodiment 53 of the low profile electronic assembly test fixture of this invention mounted for use at a commercially available tester 55. The test fixture is used to connect a printed circuit board assembly (hereinafter referred to interchangeably as PCBA or UUT) 57 to the tester system 55 using a single chamber for both wiring and vacuum establishment (as is commonly utilized). Commercially available test systems typically utilize an interface 59 including a plurality of conductive interface spring probe contacts 61 in a uniform pattern or grid 62.

Test fixture 53 is configured to allow simultaneous electrical connection of a large number of contact points on UUT 57 to the standard grid of spring biased probes 61 on tester 55. Fixture 53 primarily includes mount 65 formed by frame 67, interface bed 69 and dynamic plate assembly 71. Vacuum assist hood 73 is provided as is known in systems utilizing vacuum actuation. Chamber 75 is thus defined by mount 65 bounded by the top surface of bed 69 and dynamic diaphragm plate 77 of assembly 71.

Dynamic plate assembly 71 can include only plate 77, or may include also various positioning guides/supports as hereinafter described. In its simplest form, plate 77 may stand alone on shoulder 81 of frame 67 with only upper seal 83 therebetween and without further structure identified with assembly 71. To better protect against flexure of plate 77, however, additional structure may be desired to enhance support across the plane of plate 77 after application of the force drawing the plate downward (i.e., vacuum applied to chamber 75, for example), as will be described hereinbelow. Moreover, additional means for positioning UUT 57 is desirable in a more complete embodiment of assembly 71 as describe below.

Figure 5A:
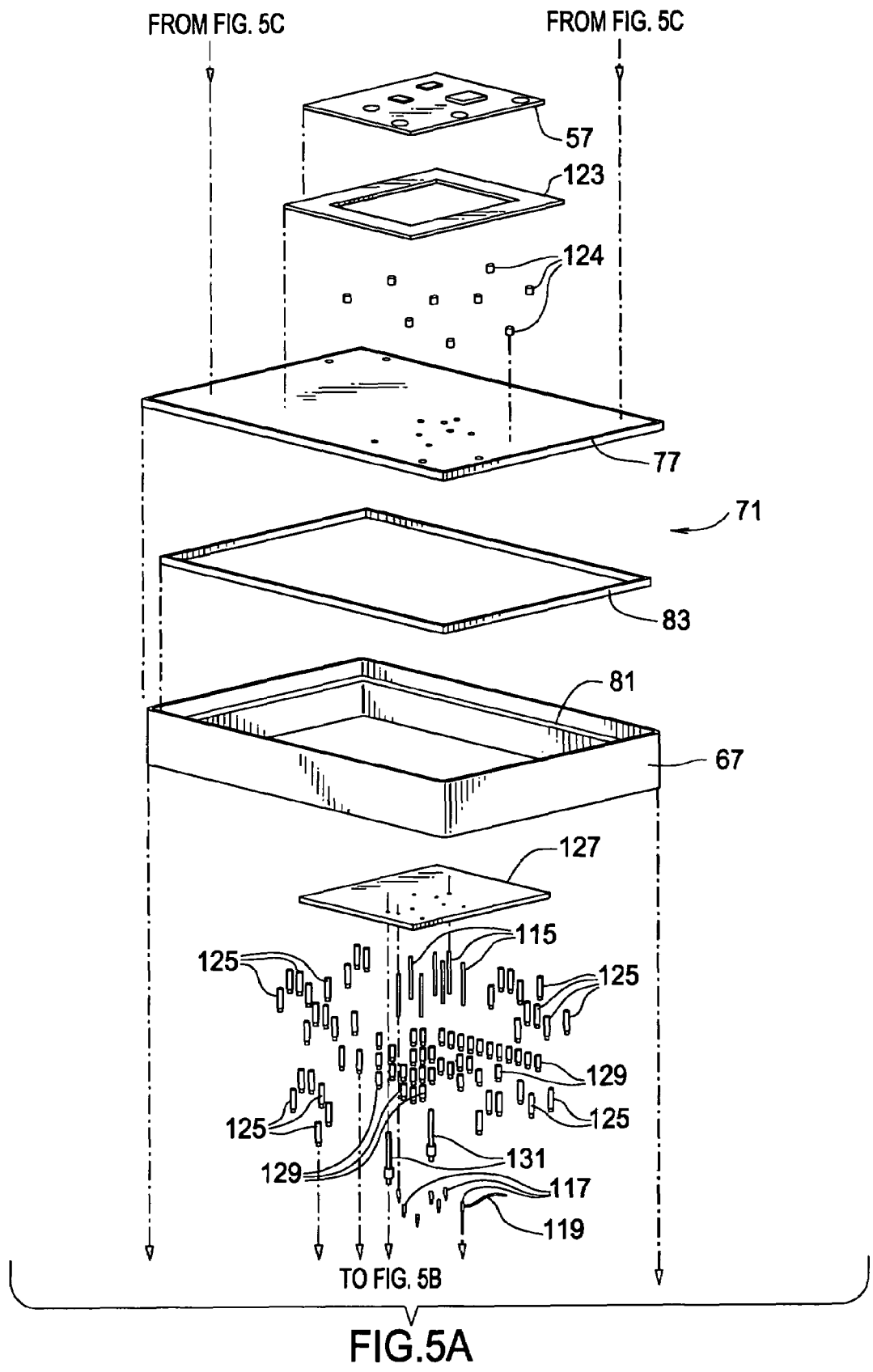
FIGS. 5A through 5C are exploded views of the test fixture of this invention shown in FIGS. 1 through 4.
Figure 5B:
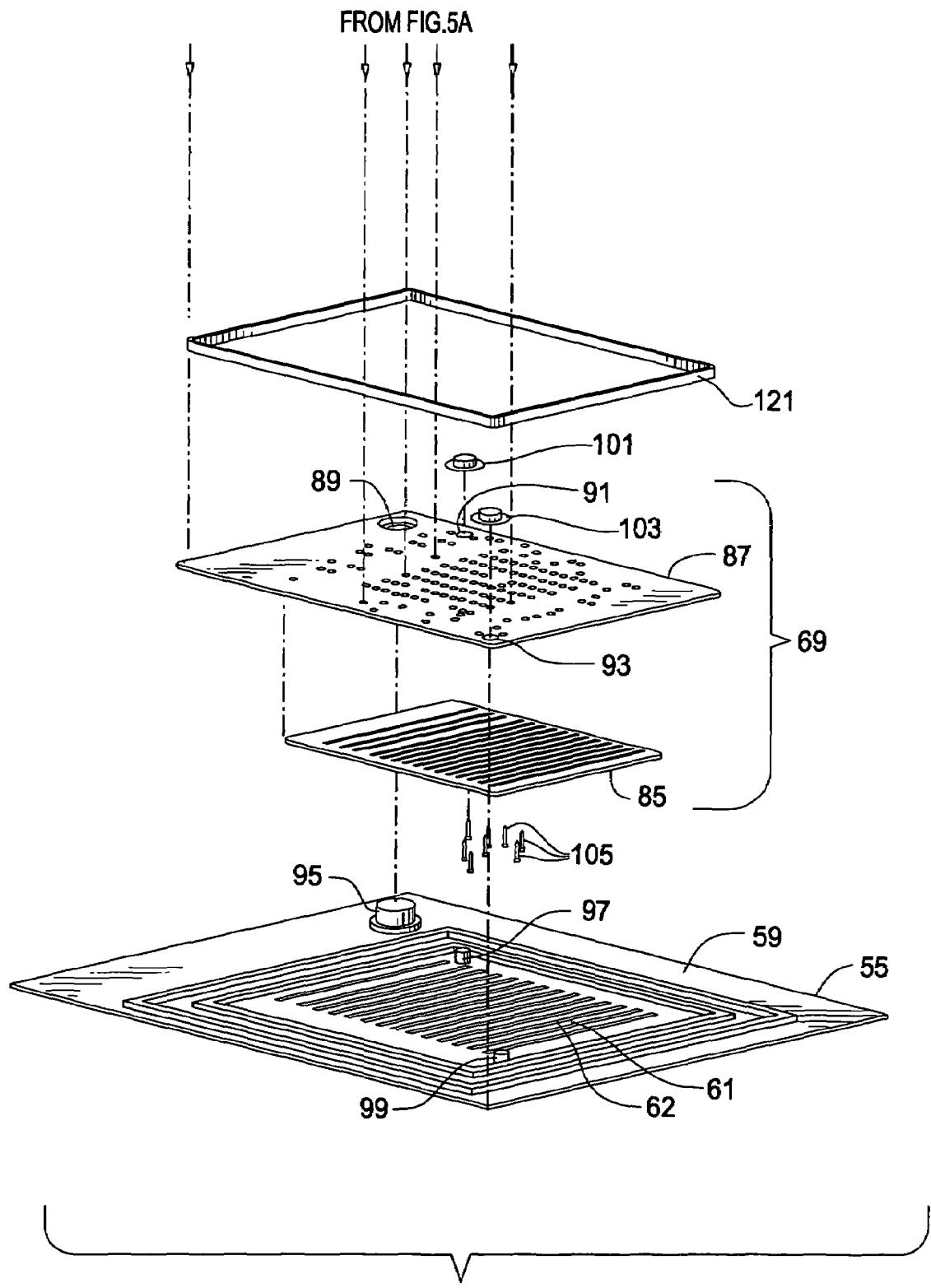
Figure 5C:
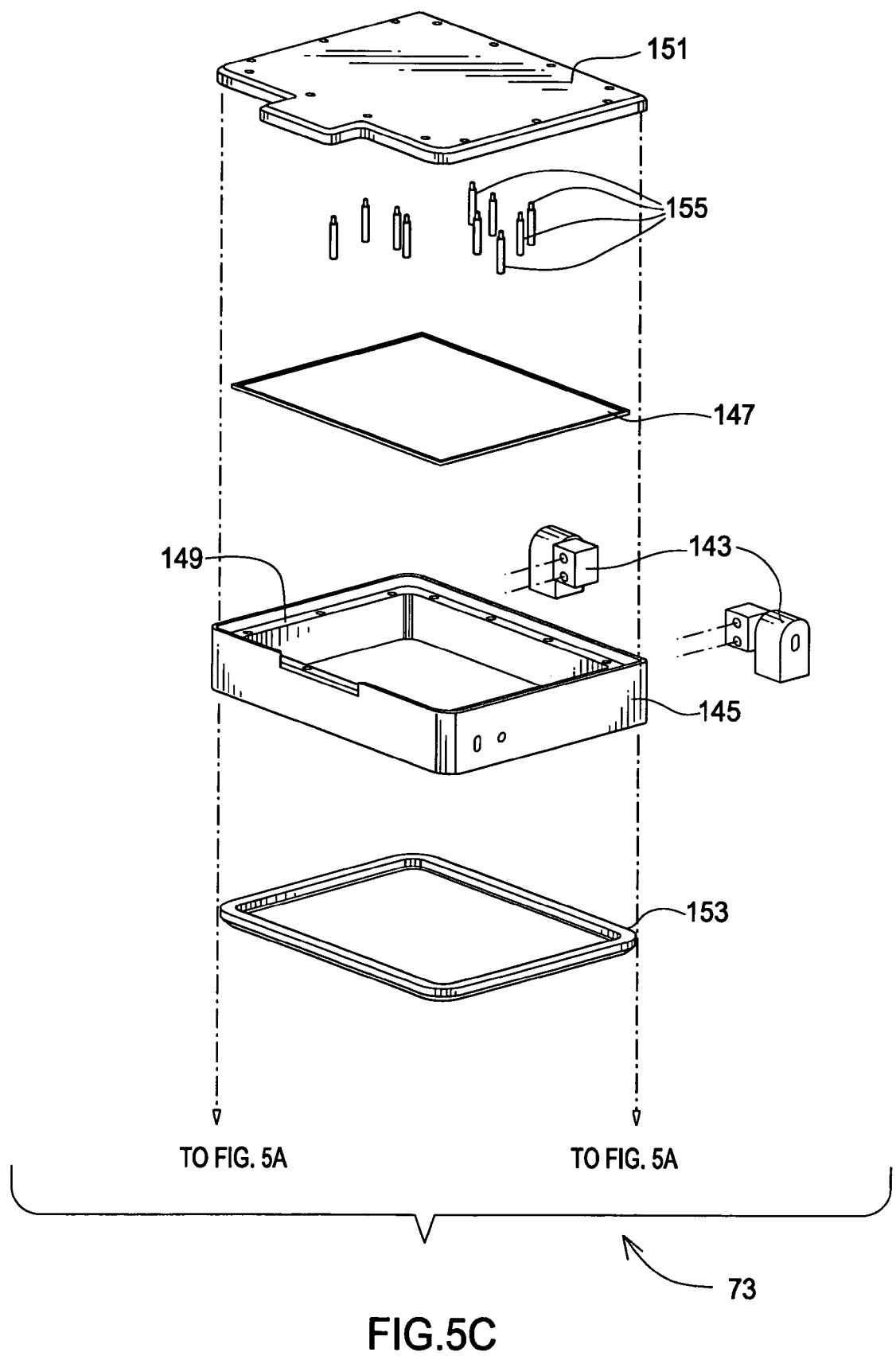

Interface bed 69 is preferably formed from mechanically stable and electrically insulating material such as fiberglass and is preferably a unitary construction, though two part constructions as shown in the FIGURES may be utilized. In such case bed 69 includes contact plate 85 and terminal plate 87. As shown in FIG. 5B, contact plate 85 is predrilled to match pattern 62 of probe contacts 61 of tester interface 59. Terminal plate 87 may also be predrilled or may be drilled as necessary to accommodate the fittings applied, and includes openings 89, 91 and 93 to accommodate vacuum input 95 and positioning and securing pins 97/99, respectively, at tester interface 59 (other arrangements are possible to accommodate different testers or means of applying mechanical forces to the fixture). Fixture 53 is secured on tester 55 by vacuum or other force and/or by friction caps 101/103 over pins 97/99 (see FIG. 5B).

Figure 4:
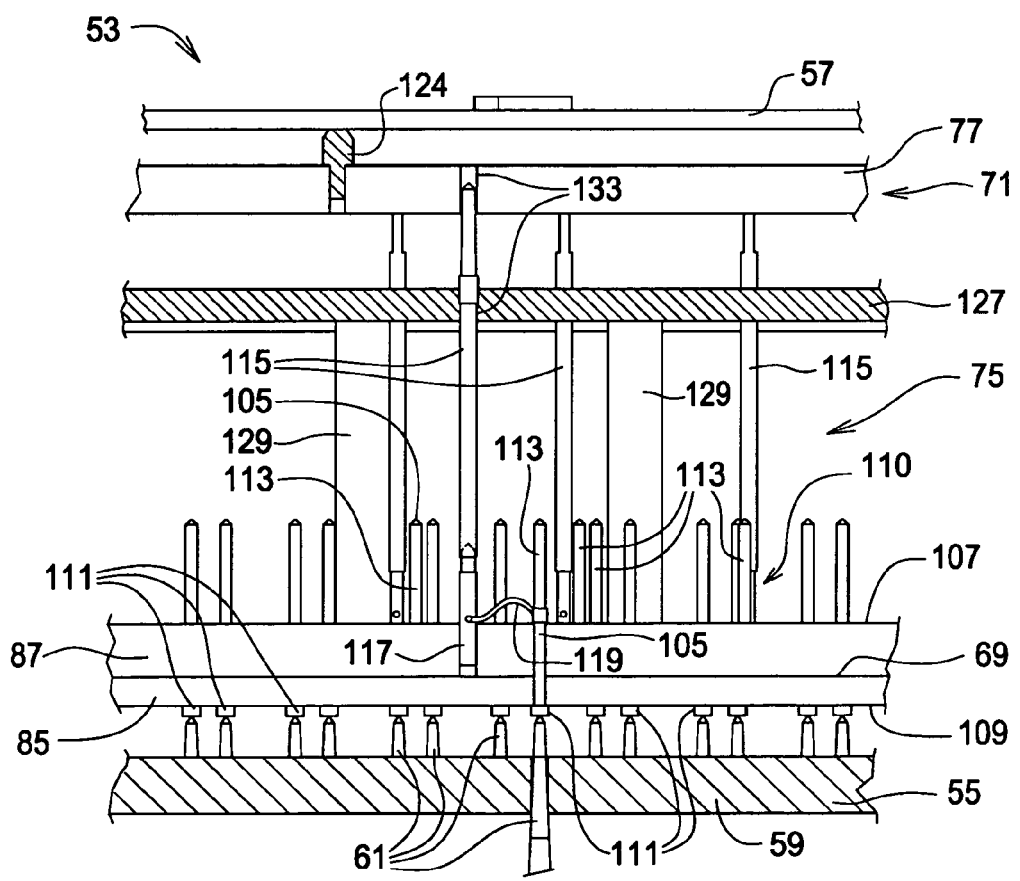
FIG. 4 is an enlarged sectional view providing a detailed illustration of one portion of the first embodiment of the test fixture of this invention as shown in FIG. 3.

A plurality of conductive terminals 105 (of which, as with many other of the hardware fixtures herein, only a few are illustrated in the FIGURES, but which, in the case of terminals 105, may number as many as probe contacts 61 of tester interface 59) are pressed through bed 69 between top and bottom surfaces 107 and 109, respectively, establishing a terminal field 110 (see FIG. 4) corresponding to at least portions of pattern 62 of contacts 61 of tester interface 59. As shown in FIG. 4, each terminal 105 includes a rigid contact node 111 at one end positioned at bottom surface 109 of bed 69, and are positioned (by way of the predrilled pattern) to correspond to position of one of the conductive interface probe contacts 61 of tester interface 59. A connection facility 113 is positioned at the opposite end of terminals 105 adjacent to top surface 107 of bed 69 (illustrated herein as a wire wrapping posts, though any connecting means, such as solder or welding surfaces, press fittings, insulation displacement fittings or the like, could be used).

Conductive spring biased probes 115 (any known variety of spring probe manufactured to the correct length could be used; for example see QA Technology U.S. Pat. Nos. 4,885, 533 and 6,570,399) are positioned at top surface 107 of bed 69 laterally adjacent to terminals 105 in terminal field 110. The probes are positioned in unique pseudo random locations, as defined by the design and layout of the specific UUT. Each probe 115 provides a path of electrical conduction to a terminator (pin or socket depending upon construction) 117 that is pressed into the interface bed 69 and that is configured to firmly hold the probes. The connection of probes 115 to terminators 117 is of a nature that minimum electrical impedance is encountered and good mechanical location and repeatability is assured (see the QA Technology citation, supra).

Wire 119 (see FIGS. 4 and 5A) couples paired probe/terminators 115/117 and connection facilities 113 of terminals 105 (any other reliable method of connection is acceptable—including wire wrap, solder, resistive weld, mechanical press fit, insulation displacement and the like). The selection of each terminal 105 (and thus contact 61 of tester 55) to be coupled to a probe/terminator 115/117 can be done manually or using software based algorithms. The objective is to minimize the wire length and thus overall signal path.

The mechanical function of fixture 53 is activated by evacuating air from chamber 75. Vacuum seal (gasket) 121 is provided between interface bed 69 and frame 67. This gasket is static and needs minimum compression. Dynamic plate 77 is sealed against frame 67 by the upper fixture vacuum seal (gasket) 83. This seal is dynamic and functions to provide the vertical movement of dynamic assembly 71 and thus UUT 57 upon vacuum application. UUT 57 is sealed and positioned at dynamic plate 77 by a perimeter UUT seal (gasket) 123, and spacing is maintained by stops 124. The application of vacuum compresses upper fixture seal 83 which results in the engagement of the field of spring probes 115 at the selected circuit nodes of UUT 57.

The extent of downward travel of dynamic plate 77 of assembly 71 is constrained by support columns 125 pressed into interface bed 69. These columns are placed on a evenly spaced grid in the region outside the field of spring probes 115. Assembly 71 may include probe guide plate 127 maintained on support columns 129 pressed into interface bed 69 and mounted over UUT guide pins 131. Columns 129 are placed on a space available basis inside the field of spring probes 115. At least plate 127 (and, preferably also plate 77, though this need not be the case unless plate 77 is the only plate in assembly 71) has a plurality of openings 133 therethrough corresponding to the positions of conductive probes 115 at bed 69. Guide pins 131 are mounted in one of columns 129 through plate 127 (guide pins 131 and the related columns 129 are preferably a single construction), plate 77 and UUT 57 slidably mounted at openings 137 over pins 131 (see FIGS. 6A and 6B). Pins 131 assure accurate positioning of UUT 57 relative to the field of probes 115.

As may be appreciated, downward travel of dynamic plate 77 of assembly 71 is further limited by guide plate 127 and shoulder 139 at fixture mount frame 67 (FIGS. 6A and 6B), thus nearly eliminating undesirable flexure of plate 77 during vacuum application. Another purpose of probe guide plate 127 is to stiffen probes 115 and further assure accurate probe alignment.

Vacuum assist hood 73 (best illustrated in FIGS. 3 and 5C) is connected with mount 65 at hinges 143 which are also connected to hood frame 145. Top seal 147 between frame lip 149 and handled lid 151, and bottom seal 153 at the bottom of frame 145 for compression against plate 77, preserve vacuum when applied. Lid 151 is secured at frame 145 using screws or the like. Columns 155 are pressed into lid 151 at positions selected so that columns 155 will press against UUT 57 when vacuum is applied.

Where prior fixture designs allowed probe plate 18 (see FIG. 1) to flex when vacuum was applied due to inadequate support, fixture 53 of this invention deletes the probe plate, utilizing instead interface bed 69 to hold and support probes 115. Since bed 69 is supported across its entire area by attachment to tester interface 59, flexure is substantially eliminated. The engagement of the field of spring probes 115 at selected nodes of UUT 57 is thus stabilized and only the dynamics of probe engagement to UUT 57 need be considered.

Figure 7:
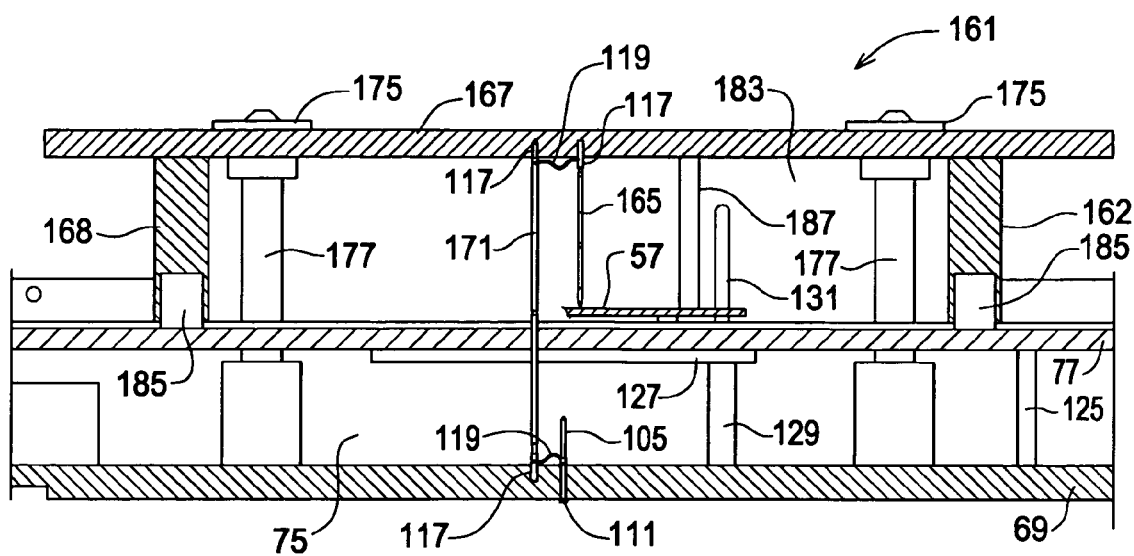
FIG. 7 is a partial sectional view of a second embodiment of the electronic assembly test fixture of this invention.
Figure 8:
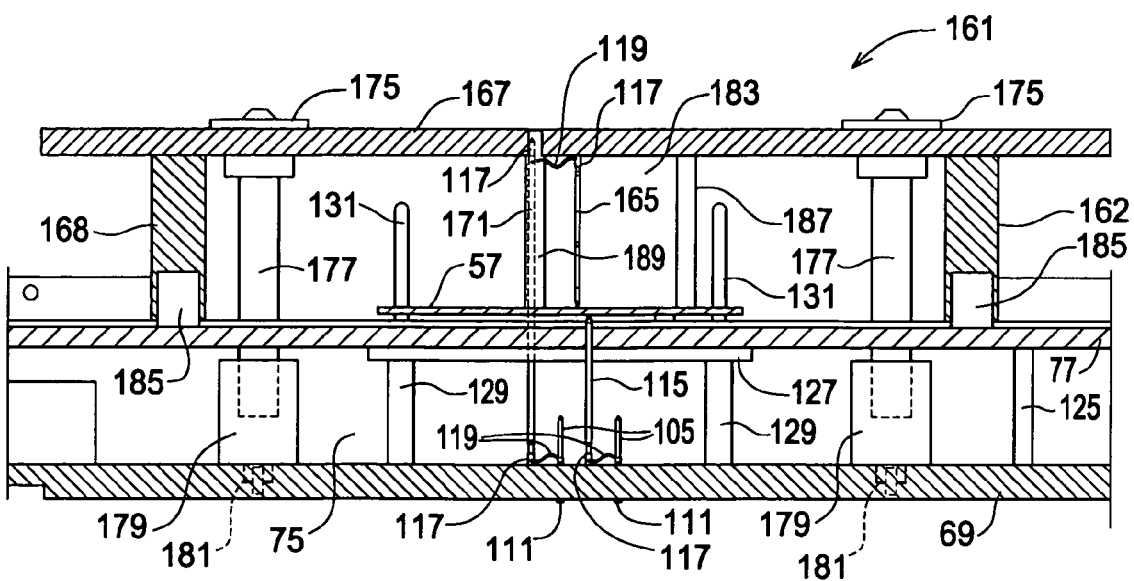
FIG. 8 is a partial sectional view of the embodiment of the electronic assembly test fixture of this invention shown in FIG. 7 taken at a different section location.

With reference to FIGS. 7 and 8, a second embodiment 161 of the fixture of this invention is illustrated wherein top access unit 162 provides electronic assembly top access by a probe field. As shown, fixture 161 is capable of allowing both top and bottom probe contact with electronic assembly 57 (though top side testing only could be accommodated utilizing fixture 161). Fixture 161 utilizes many of the same features as heretofore described with regard to fixture 53 (and thus their description will not be repeated, like numbering of common elements being utilized), and works in accordance with test fixture 53 of this invention.

Spring biased top access probes 165 are positioned above UUT mounting on plate 77 at dynamic top plate 167 in a field selected in view of the nodes at UUT 57 to be contacted by probes 115 at the top of UUT 57. Probes 165 are of the same or similar construction as heretofore referenced, and are secured in terminators 117, as described hereinabove, pressed into top plate 167. Plate 167 is sealingly mounted on frame 168 in turn sealingly mounted at plate 77.

The primary issue encountered in top access fixture design is providing a signal path from selected terminals 105 at bed 69 to the top access spring biased probes 165. To achieve this, a transfer probe assembly 171 is mounted at terminators 117 at top plate 167 and bed 69. Two spring probes (top and bottom) like those used elsewhere herein may be employed in the assembly, or a single, specially designed spring probe may be utilized. Top and bottom terminators 117 are coupled to a spring probe 165 terminator 117 at top plate 167 and to a terminal 105 at bed 69, respectively, using wires 119 (or other known connection scheme).

In addition, plural linear bushings 175 (preferably at least four) are mounted through top plate 167 at its perimeter to align plate 167 with bed 69 and plate 77. Linear bushing rails 177 are mounted through plate 77 at alignment bases 179, allowing plate 167/frame 168 to move with the system. Each alignment base 179 is attached to interface bed 69 using alignment pins 181.

Fixture 161 begins mechanical movement when air is evacuated from vacuum chamber 75 and top access chamber 183 (through any convenient opening at plate 77). Plate 77 compresses upper fixture seal 83 (FIG. 6B) allowing spring biased probes 115 to make contact with the test points on the bottom of UUT 57 (if accommodated). Top access unit 162 moves in unison with plate 77 as accommodated by linear bushings 175 sliding along linear bushing rails 177. Once plate 77 stops (as described hereinabove), top access unit 162 compresses against top access seal (gasket) 185 until pusher column 187 makes contact with plate 77 and UUT pusher column 189 touches UUT 57. At this juncture, spring biased probes 165 are in contact with test points on the top of UUT 57, transfer probe assemblies 171 providing the signal path to terminals 105.

As may be appreciated from the foregoing, the test fixtures of this invention are typically used for testing printed circuit board assemblies (PCBA's), and are adapted for use with commercially available testers utilized for such purposes. However, other electronic assemblies that are tested using spring probes and mechanical (vacuum) actuation to affect electrical connection could make use of the fixtures and methods of this invention.

What is claimed is:

1. An electronic assembly test fixture mountable at a tester having a plurality of conductive interface contacts, said fixture comprising:
an interface bed having top and bottom surfaces;
a plurality of conductive terminals extending through said interface bed between said top and bottom surfaces thereof, each of said terminals having a node at one end and a connection facility at an opposite end, said node of each of said terminals positioned at said bottom surface of said bed to correspond to position of one of the conductive interface contacts of the tester and said connection facility of each of said terminals positioned at said top surface of said bed;
a plurality of conductive probes secured at said top surface of said bed and selectively conductively couplable to a selected said terminal connection facility;
a plate assembly having a plurality of openings therethrough corresponding to conductive probe positions at said bed, said plate assembly including a probe guide plate and a dynamic plate, said probe guide plate supported in a spaced relationship relative to said bed and having said openings therethrough, and said dynamic plate supporting the electronic assembly thereat; and
a mount having said bed secured at one end and said plate assembly dynamically positioned at an opposite end.

2. The fixture of claim 1 wherein said conductive probes are spring probes, said fixture further comprising a plurality of terminators secured in said bed, each for receiving a spring probe therein.

3. The fixture of claim 1 further comprising sealing at said mount so that a partial vacuum can be applied in a chamber defined by said mount, said bed and said plate assembly to selectively effect movement of at least a portion of said dynamic plate assembly.

4. The fixture of claim 1 wherein movement of said dynamic plate is constrained by said guide plate and at least one of support columns attached to said bed and a shoulder at said mount.

5. The fixture of claim 1 further comprising:
a top dynamic plate spaced from said plate assembly and dynamically positioned at said opposite end of said mount;
a plurality of conductive top access probes secured at said top dynamic plate; and
a plurality of conductive transfer probe assemblies extended through said plate assembly and secured at said bed and said top dynamic plate, different ones of said transfer probes conductively coupled to selected ones of said top access probes and said connection facilities of said conductive terminals at said bed.

6. The fixture of claim of 5 further comprising sealing at said mount so that a partial vacuum can be applied in an area defined by said mount, said bed, said plate assembly and said top dynamic plate to selectively effect movement of at least a portion of said plate assembly and said top dynamic plate to provide both top and bottom probe contact at said electronic assembly.

7. A low profile printed circuit board assembly test fixture mountable at a tester having a plurality of conductive interface contacts, said fixture comprising:
a low profile mount including an interface bed having top and bottom surfaces at one end and a dynamic plate movably positioned at an opposite end, a chamber being thereby defined and bounded by said top surface of said bed and said plate, said chamber having an opening thereto for evacuating air from said chamber to effect movement of said plate;
a vacuum assist hood hingedly connected with said mount;
a plurality of conductive terminals extending through said interface bed between said top and bottom surfaces thereof, each of said terminals having a node at one end positioned at said bottom surface of said bed to correspond to position of one of the conductive interface contacts of the tester, and having a connection facility at an opposite end positioned at said top surface of said bed in said chamber;
a plurality of conductive probes in said chamber secured at said top surface of said bed and selectively conductively couplable to a selected said terminal connection facility, said probes extending through said plate; and
positioning means adjacent to said plate for selectively positioning the electronic assembly at said plate.

8. The fixture of claim 7 wherein said low profile mount includes a frame and lower and upper seals positionable adjacent to said interface bed and said dynamic plate, respectively.

9. The fixture of claim 7 wherein said chamber opening is formed in said bed.

10. The fixture of claim 7 wherein said positioning means includes guide pins extending through said plate and a perimeter gasket positioned on said plate.

11. The fixture of claim 7 wherein said probes are spring probes, said fixture further comprising a probe guide plate held on supports in said chamber, said dynamic plate and said guide plate having openings therethrough corresponding to conductive probe positions at said bed, said guide plate position selected to constrain movement of said dynamic plate.

12. The fixture of claim 7 further comprising:
- a dynamic top plate spaced from said dynamic plate and dynamically positioned at said opposite end of said mount;
- a plurality of conductive top access probes secured at said dynamic top plate; and
- a plurality of conductive transfer probe assemblies extended through said dynamic plate and secured at said bed and said dynamic top plate, different ones of said transfer probes conductively coupled to selected ones of said top access probes and said connection facilities of said conductive terminals at said bed;
- wherein, when air evacuation from said chamber is applied, selective movement of said dynamic plate and said dynamic top plate is effected to provide both top and bottom probe contact at said electronic assembly.

13. A test fixture for accessing selected circuit nodes on an electronic assembly for assembly testing using a tester having a pattern of conductive interface contacts at one part thereof, said test fixture comprising:
- a field of conductive terminals positioned to correspond to at least some portions of the pattern of conductive interface contacts of the tester, said terminals configured for engaging the interface contacts;
- probes positioned laterally adjacent to said terminals in said field of terminals, said probes positioned in a pattern corresponding to positions of the selected circuit nodes of the electronic assembly, different ones of said probes selectively conductively coupled with different ones of said terminals;
- holding means for dynamically holding the electronic assembly at a selected location relative to the tester and said pattern of said probes;
- a top plate for dynamically positioning a plurality of conductive top access probes adjacent to the electronic assembly and selected circuit nodes thereof opposite the electronic assembly from said holding means;
- means communicating through said holding means for establishing a signal path from said top access probes to different ones of said terminals; and
- vacuum means for causing movement of said holding means toward said field of conductive terminals to effect contact between said probes and the selected circuit nodes.

14. The test fixture of claim 13 wherein said field of conductive terminals are established at an interface bed.

15. The test fixture of claim 13 further comprising a probe guide for restricting probe movement after positioning.

16. The test fixture of claim 13 further comprising supports at plural locations across said field of conductive terminals limiting flexure at said holding means after effecting contact between said probes and the selected circuit nodes of the electronic assembly.

17. The test fixture of claim 13 further comprising means for defining a chamber between said holding means and said field of conductive terminals.

* * * * *